(12) United States Patent
Lee et al.

(10) Patent No.: US 9,643,215 B2
(45) Date of Patent: May 9, 2017

(54) SUBSTRATE CLEANING APPARATUS

(71) Applicant: Samsung Display Co., Ltd., Yongin, Gyeonggi-do (KR)

(72) Inventors: Seung-Jun Lee, Yongin (KR); Jung-Hwa You, Yongin (KR); Sohra Hahn, Yongin (KR); Dong-Myung Shin, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 303 days.

(21) Appl. No.: 13/963,743

(22) Filed: Aug. 9, 2013

(65) Prior Publication Data

US 2014/0075690 A1 Mar. 20, 2014

(30) Foreign Application Priority Data

Sep. 20, 2012 (KR) ........................ 10-2012-0104565

(51) Int. Cl.

| | |
|---|---|
| *B08B 1/02* | (2006.01) |
| *B08B 1/04* | (2006.01) |
| *B08B 3/04* | (2006.01) |
| *H01L 21/677* | (2006.01) |
| *H01L 21/67* | (2006.01) |
| *B08B 1/00* | (2006.01) |

(52) U.S. Cl.
CPC ................. *B08B 1/02* (2013.01); *B08B 1/04* (2013.01); *B08B 3/041* (2013.01); *H01L 21/67046* (2013.01); *H01L 21/67051* (2013.01); *H01L 21/6776* (2013.01); *H01L 21/67706* (2013.01); *B08B 1/002* (2013.01)

(58) Field of Classification Search
CPC ......... H01L 21/67046; H01L 21/67051; H01L 21/67706; H01L 21/6776; B08B 1/02; B08B 1/002; B08B 1/04
USPC .................... 15/77, 88.3, 102, 88.2, 21.1
See application file for complete search history.

(56) References Cited

U.S. PATENT DOCUMENTS

| | | | | | |
|---|---|---|---|---|---|
| 1,930,575 | A | * | 10/1933 | Wynd ........................ | A47L 1/16 15/308 |
| 2,313,606 | A | * | 3/1943 | Webb ........................ | B08B 1/04 15/220.3 |
| 3,928,064 | A | * | 12/1975 | Holm ........................ | H05K 3/26 134/25.4 |
| 4,439,882 | A | * | 4/1984 | Holm ........................ | B08B 1/02 15/77 |
| 4,551,878 | A | * | 11/1985 | Turley ................ | B21B 45/0284 100/153 |

(Continued)

FOREIGN PATENT DOCUMENTS

| | | |
|---|---|---|
| CN | 102199007 | 9/2011 |
| JP | 10-005702 | 1/1998 |

(Continued)

*Primary Examiner* — Andrew A Horton
(74) *Attorney, Agent, or Firm* — Knobbe Martens Olson & Bear LLP (57) ABSTRACT

A substrate cleaning apparatus is provided. The substrate cleaning apparatus includes a plurality of transfer rollers for transferring a substrate; a liquid chemical feeder supplying a liquid chemical to a first surface of the substrate; wherein the liquid chemical feeder comprises a first housing and a first cleaning roller rotatably installed within the housing and having an upper portion configured to contact with the substrate.

15 Claims, 5 Drawing Sheets

(56) References Cited

U.S. PATENT DOCUMENTS

| | | | | |
|---|---|---|---|---|
| 4,733,422 | A | * | 3/1988 | Schramm .............. G03F 7/3057 |
| | | | | 15/102 |
| 4,843,673 | A | * | 7/1989 | Sendzimir ........... B21B 45/0284 |
| | | | | 100/153 |
| 5,212,530 | A | | 5/1993 | Harada et al. |
| 5,979,011 | A | * | 11/1999 | Miyawaki ............... B08B 1/007 |
| | | | | 15/104.002 |
| 2005/0108847 | A1 | * | 5/2005 | Fehring ..................... B08B 1/02 |
| | | | | 15/308 |
| 2007/0227562 | A1 | * | 10/2007 | Lee .......................... B08B 1/02 |
| | | | | 134/34 |
| 2012/0006485 | A1 | * | 1/2012 | Tanabe ................... B08B 3/022 |
| | | | | 156/345.11 |

FOREIGN PATENT DOCUMENTS

| | | |
|---|---|---|
| JP | 2006-278713 | 10/2006 |
| KR | 10-0852119 | 7/2008 |
| KR | 10-2009-0057797 | 8/2009 |
| KR | 10-2011-0062531 | 6/2011 |

\* cited by examiner

Backward direction ← → Forward direction

FIG. 4

Backward direction ←——— ———→ Forward direction

FIG. 5

Backward direction ← → Forward direction

SUBSTRATE CLEANING APPARATUS

INCORPORATION BY REFERENCE TO ANY PRIORITY APPLICATIONS

This application claims priority to and the benefit of Korean Patent Application No. 10-2012-0104565 filed in the Korean Intellectual Property Office on Sep. 20, 2012, the entire contents of which are incorporated herein by reference.

BACKGROUND

Field

The present disclosure relates a substrate cleaning apparatus.

Description of the Related Technology

Among display devices, flat panel displays, which are flat and thin, include a liquid crystal display (LCD), a plasma display device, an organic light emitting diode (OLED) display, and the like.

A flat panel display includes a display panel for displaying an image, and in order to fabricate a display panel, various processes, such as, for example, an etching process, a cleaning process, and the like, are performed.

The cleaning process is not a unit process for fabricating a device in actuality, but it affects a process yield and product performance.

The above information disclosed in this Background section is only for enhancement of understanding of the background of the invention and therefore it may contain information that does not form the prior art that is already known in this country to a person of ordinary skill in the art.

SUMMARY OF CERTAIN INVENTIVE ASPECTS

The present invention has been made in an effort to provide a substrate cleaning apparatus having advantages of preventing a liquid chemical from being splashed to an upper portion of a substrate in cleaning a lower surface of the substrate.

An embodiment of the present invention provides a substrate cleaning apparatus including: a plurality of transfer rollers for transferring a substrate; a liquid chemical feeder supplying a liquid chemical to a first surface of the substrate; wherein the liquid chemical feeder comprises a first housing and a first cleaning roller rotatably installed within the housing and having an upper portion configured to contact with the substrate.

The substrate cleaning apparatus may further include: a pure water feeder supplying pure water to the first surface of the substrate configured to remove the fluid chemical supplied to the first surface, wherein the pure water feeder comprises: a second housing and a second cleaning roller rotatably installed within the housing and having an upper portion configured to contact with the substrate.

The substrate cleaning apparatus may further include: an air supply unit installed on an upper portion of a second surface of the substrate in order to prevent the liquid chemical from being splashed to the second surface of the substrate.

Each of the liquid chemical feeder and the pure water feeder may include: a pump supplying a fluid to the interior of the housing; and a fluid storage tank storing a fluid supplied to the interior of the housing, wherein a portion of the cleaning roller is immersed in the fluid supplied to the interior of the housing.

The cleaning roller may include a cylindrical body and a plurality of brushes positioned to the outer circumference surface of the cylindrical body.

The substrate cleaning apparatus may further include: a splash preventing member disposed adjacent to the cleaning roller at a position higher than a rotational central axis of the cleaning roller in order to prevent the cleaning roller from being moved when impregnated with a large amount of fluid when rotated.

The splash preventing member may be positioned to be lower than the substrate and higher than the rotational central axis of the cleaning roller.

The splash preventing member may be a pipe disposed to be parallel to the rotational central axis.

The splash preventing member may be formed as a pair at both sides of an upper portion of the cleaning roller.

A length direction of the housing may be a direction in which an axis of the cleaning roller extends, and when the direction in which the axis of the cleaning roller extends is perpendicular to a transfer direction of the substrate, a width of the housing parallel to the transfer direction of the substrate may be longer than a diameter of the cleaning roller.

The splash preventing member may further include a splash preventing cover positioned on an upper surface of the housing, the cover configured to prevent the fluid from being splashed according to a rotation of the cleaning roller.

The splash preventing cover may be formed as a pair in both sides of the cleaning roller, and an upper end portion of the cleaning roller may be protruded to an opening between the pair of splash preventing covers.

The air supply unit may include a pair of air knives, and the pair of air knives may be positioned above the liquid chemical feeder and the pure water feeder.

The pair of air knives may be positioned in front and rear sides of the cleaning roller when viewed in the transfer direction of the substrate.

Among the pair of air knives, the air knife positioned in the front side may be sloped to the rear side, and the air knife positioned in the rear side may be sloped to the front side.

When viewed in the transfer direction of the substrate, the pure water feeder may be positioned in a rear side of the liquid chemical feeder.

A plurality of pure water feeders may be formed.

The apparatus may further include a substrate movement sensor spaced apart from the first and/or the second housing in front of the first and/or the second housing when viewed in the transfer direction of the substrate.

When the substrate movement sensor senses that the substrate enters an upper side of the first and/or the second housing and is discharged from the upper side of the first and/or the second housing, a speed of the brushes may be variably controlled.

When viewed in the transfer direction of the substrate, a speed at which the front end portion of the substrate moves to pass the movement sensor to reach an upper portion of the cleaning roller and a speed at which the rear end portion of the substrate moves to pass the movement sensor to reach the upper portion of the cleaning roller may be slower than a speed at which a central portion of the substrate moves to pass an upper portion of the cleaning roller.

DETAILED DESCRIPTION OF CERTAIN INVENTIVE EMBODIMENTS

Hereinafter, embodiments will be described in detail with reference to the accompanying drawings such that they can be easily practiced by those skilled in the art to which the present invention pertains. As those skilled in the art would realize, the described embodiments may be modified in various ways, without departing from the spirit or scope of the present invention. The drawings and description are to be regarded as illustrative in nature and not restrictive. Like reference numerals generally designate like elements throughout the specification.

In order to clean a lower surface of a substrate of a flat panel display, pure water or a liquid chemical is typically supplied by a nozzle and removed by using a brushes, and in this manner, upper and lower surfaces of the substrate are simultaneously cleaned. However, since a conventional cleaning apparatus typically supplies pure water and a liquid chemical by a shower nozzle, the liquid chemical is splashed to an upper surface of the substrate, on which display elements are positioned in many cases. In the case of a substrate cleaning apparatus according to an embodiment of the present invention, since a liquid chemical and pure water is applied to a substrate by using a brushes to clean a lower surface of the substrate, the liquid chemical can be prevented from being splashed to an upper surface of the substrate, on which the display elements are positioned, while the lower surface of the substrate is being cleaned.

Figure 1:
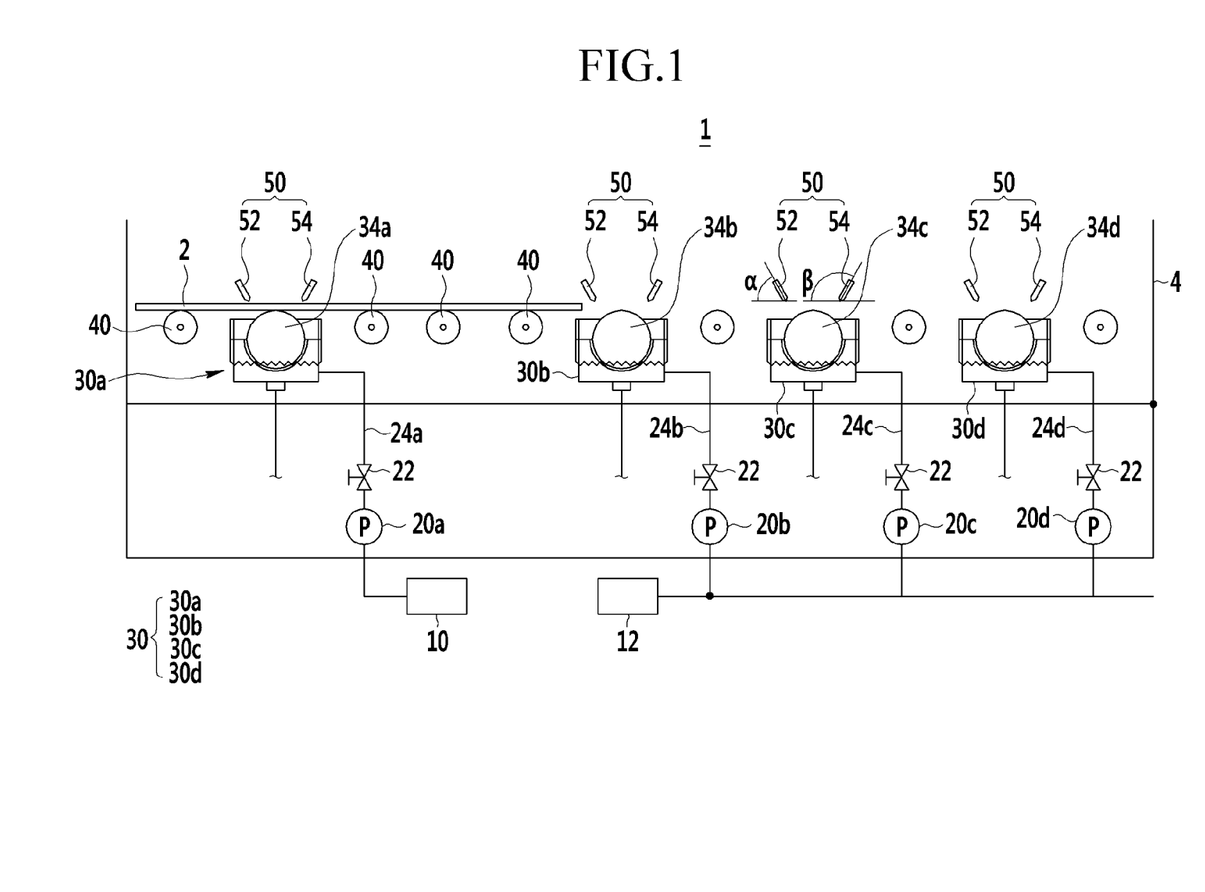
FIG. 1 is a view illustrating a substrate cleaning apparatus according to an embodiment of the present invention.

FIG. 1 is a view illustrating a substrate cleaning apparatus according to an embodiment of the present invention.

Referring to FIG. 1, a substrate cleaning apparatus 1 according to an embodiment of the present invention may include a transfer roller 40, a cleaning unit 30, and an air supply unit 50.

As illustrated in FIG. 1, the transfer roller 40, a component for transferring a substrate 2, may include a plurality of rollers installed on a frame 4. A plurality of transfer rollers 40 may be arranged at equal intervals in a horizontal direction.

A rotation speed of each of the plurality of transfer rollers 40 may be regulated by a motor (not shown) in order to regulate a transfer speed of the substrate 2.

In an embodiment of the present invention, the substrate cleaning apparatus 1 is described below. In the embodiment of FIG. 1, the apparatus 1 has a structure in which the substrate 2 is introduced from the first side, e.g. the left side when viewed from FIG. 1, and it is cleaned when being transferred to the second side to be opposite to the first side, e.g. the right side. Then, the display (not shown) elements are positioned on the upper surface of the substrate 2.

In order to clean a lower surface of the substrate 2, while the substrate 2 is being transferred by passing the plurality of transfer rollers 40, the substrate cleaning apparatus 1 according to an embodiment of the present invention includes the cleaning unit 30 and the air supply unit 50.

In an embodiment of the present invention, the cleaning unit 30 includes a liquid chemical feeder 30a for supplying a liquid chemical to the lower surface of the substrate 2 and the first to the third pure water feeders 30b, 30c, and 30d supplying pure water for removing the liquid chemical which has been supplied to the substrate.

Referring to FIG. 1, the liquid chemical feeder 30a is positioned in a front side (namely, the left side in FIG. 1) ahead of the first to the third pure water feeders 30b, 30c, and 30d when viewed in a transfer direction of the substrate 2, and the pure water feeders 30b, 30c, and 30d are disposed in a rear side of the liquid chemical feeder 30a.

Referring to FIG. 1, in an embodiment of the present invention, three pure water feeders 30b, 30c, and 30d are installed, but an amount of the pure water feeders is not limited thereto.

In an embodiment of the present invention, a liquid chemical stored in the liquid chemical storage tank 10 is supplied to the interior of the liquid chemical feeder 30a through a first supply pipe 24a by the first pump 20a, and the liquid chemical for cleaning the lower surface of the substrate 2 is subsequently applied to the lower surface of the substrate 2 by a cleaning roller (34a) installed in the liquid chemical feeder 30a.

Pure water stored in a pure water storage tank 12 is supplied to the interior of the first to the third pure water feeder 30b, 30c, and 30d through the second to the fourth supply pipes 24b, 24c, 24d by the second to the fourth pump 20b, 20c, 20d, and pure water for cleaning the liquid chemical present on the lower surface of the substrate 2 is subsequently applied to the lower surface of the substrate 2 by cleaning roller 34b, 34c, 34d installed in the first to the third pure water feeder 30b, 30c, and 30d.

Air supply units 50 are installed above the liquid chemical feeder 30a and the first to the third pure water feeders 30b, 30c, and 30d. The air supply units 50 include a pair of air knives 52 and 54, respectively.

Among the pair of air knives 52 and 54, when viewed in the transfer direction of the substrate 2, the air knife positioned in the front side is defined as a first air knife 52 and the air knife positioned in the rear side is defined as a second air knife 54, the first air knife 52 is disposed to be sloped toward the rear side and the second air knife 54 is disposed to be sloped toward the front side. Referring to FIG. 1, the angle α between the first air knife 52 and the substrate 2 may be greater than 0 degree and less than 90 degree. The angle β between the first air knife 54 and the substrate 2 may be greater than 90 degree and less than 180 degree.

The first air knife 52 and the second air knife 54 are positioned in front and rear sides of cleaning roller rotational shafts within the liquid chemical feeder 30a and the first to the third pure water feeder 30b, 30c, and 30d, based on the rotational shaft, when viewed in the transfer direction of the substrate 2, respectively.

The first and the second air knives 52 and 54 are connected to an air supply pump (not shown) for discharging air.

The first air knife 52 and the second air knife 54 jet air to the substrate 2 such that the liquid chemical or pure water may not be splashed to the upper surface of the substrate 2 while the substrate 2 is passing the cleaning unit 30 and the liquid chemical or pure water is being applied to the lower surface of the substrate 2 from the cleaning unit 30.

In an embodiment of the present invention, the liquid chemical feeder 30a and the first to the third pure water feeder 30b, 30c, and 30d may have the same structure, except that they supply different types of fluids to the substrate, so hereinafter, the liquid chemical feeder 30a and the first to the third pure water feeder 30b, 30c, and 30d, and the constituent elements for supplying a fluid chemical and pure water to the liquid chemical feeder 30a and the first to the third pure water feeder 30b, 30c, and 30d are referred to as the cleaning unit 30, and a detailed structure of the cleaning unit 30 is described below.

Figure 2:
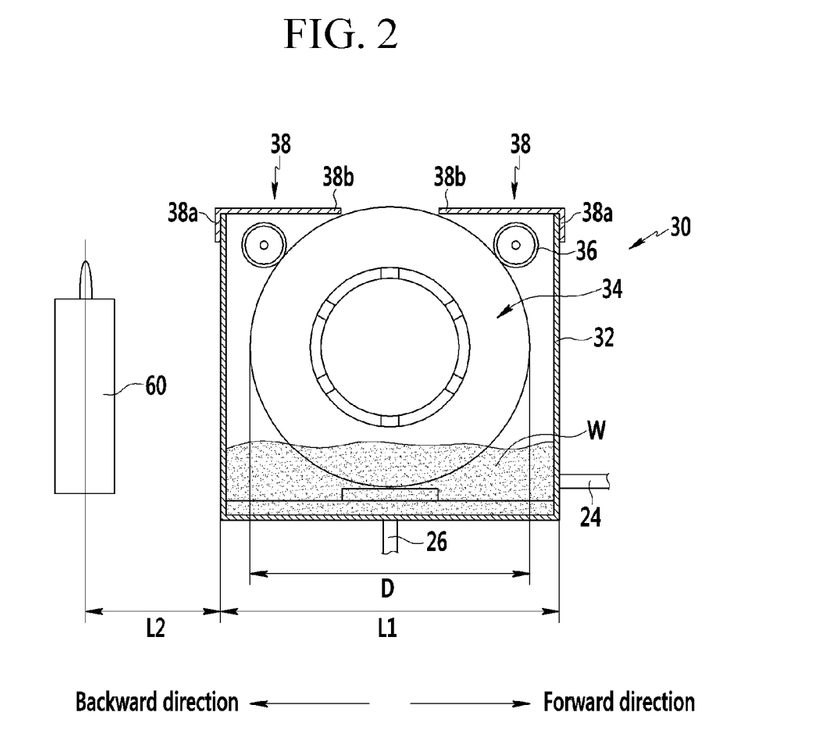
FIG. 2 is a cross-sectional view of a housing of a cleaning unit of the substrate cleaning apparatus according to an embodiment of the present invention.
Figure 3:
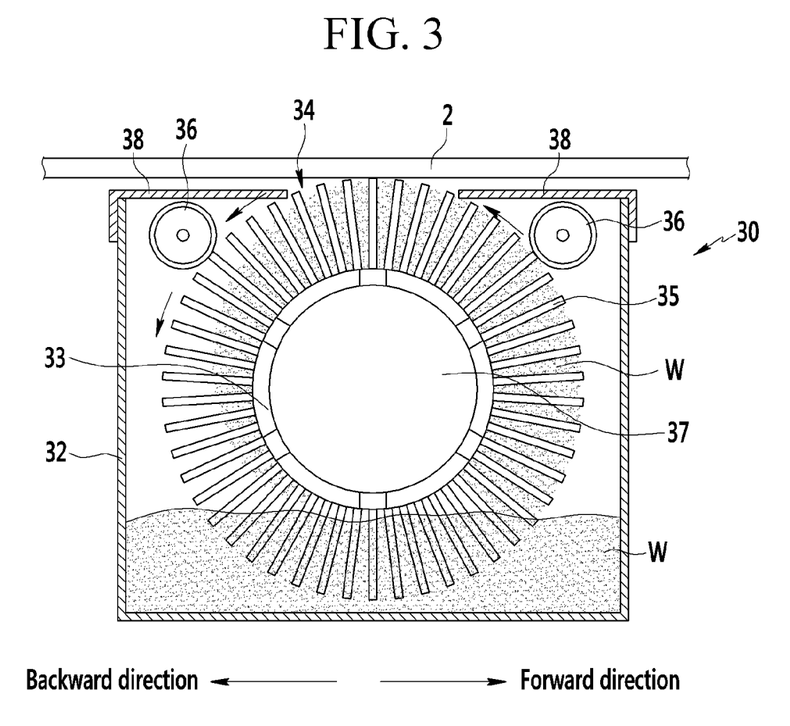
FIG. 3 is a cross-sectional view illustrating an operational state of a cleaning unit of the substrate cleaning apparatus according to an embodiment of the present invention.

FIG. 2 is a cross-sectional view of a housing of the cleaning unit 30 of the substrate cleaning apparatus according to an embodiment of the present invention. FIG. 3 is a cross-sectional view illustrating an operational state of a cleaning unit 30 of the substrate cleaning apparatus according to an embodiment of the present invention.

Referring to FIGS. 1 and 2, the cleaning unit 30 of the substrate cleaning apparatus 1 according to an embodiment of the present invention includes a housing 32, the cleaning roller 34, the pump 20, and a fluid storage tank.

The housing 32 is installed in a position lower than a height by which the substrate 2 passes, and has a watertight structure allowing a fluid W to be stored in a bottom portion thereof. The housing 32 has rectangular box-like shape having a square cross-section and extending in a width direction of the substrate 2, but the shape of the housing is not limited thereto.

The supply pipe 24 is connected to one side of the housing 32 in order to supply a fluid to the interior of the housing 32. Then, the supply pipe 24 may be connected to lower side of the housing 32.

A discharge pipe 26 is installed on the bottom portion of the housing 32 in order to discharge a fluid within the housing 32 to the outside in case that there is no need to fill the bottom portion within the housing 32 such as that the cleaning unit 30 does not operate, that the cleaning unit 30 is cleaned, or the like.

The cleaning roller 34 is rotatably installed within the housing 32. The cleaning roller 34 is a constituent element rotating with the fluid, which is stagnant on the bottom portion of the housing 32, held therein so as to be brought into contact with a lower surface of the substrate 2 positioned in an upper portion of the housing 32 to apply the fluid to the lower surface of the substrate.

Referring to FIGS. 2 and 3, the cleaning roller 34 according to an embodiment of the present invention may include a cylindrical body 33 and brushes 35 made of a PVA material and rotational shaft 37 supporting the cylindrical body 33 and the brushes 35 and extending in a direction perpendicular to the transfer direction of the substrate 2.

In one embodiment, it is illustrated that the cleaning roller 34 may include a brushes made of a PVA material, but the material and shape of the cleaning roller 34 are not limited thereto.

According to an embodiment of the present invention, a lower end portion of the cleaning roller 34 is positioned to be slightly spaced apart from the bottom surface of the housing 32, and an upper end portion of the cleaning roller 34 may be formed to be protruded upwardly from the housing 32.

A diameter D of the cleaning roller 34 is smaller than a width L1 of the housing 32 such that when the cleaning roller 34 is rotated, end portions of the cleaning roller 34 are not brought into contact with both side walls of the housing 32 in both lateral portions of the cleaning roller 34 when viewed in FIG. 2. In this manner, since the width of the housing 32 is larger than the diameter of the cleaning roller 34, when the cleaning roller 34 is rotated at a high speed, the fluid can be smoothly moved. The cleaning unit 30 has rectangular box-like shape having a square cross-section and extending in a width direction of the substrate 2, but the shape of the cleaning unit 30 is not limited thereto.

A splash preventing member 36 is installed within the housing 32. Referring to FIGS. 2 and 3, the splash preventing member 36 may be configured as a pipe disposed to be adjacent to the cleaning roller 34 at a position higher than the rotational central axis of the cleaning roller 34 in order to prevent the fluid from being splashed in an upward direction of the housing, when the cleaning roller 34 with a large amount of fluid held therein is rotated.

The splash preventing member 36 may be disposed in direction parallel to the rotational central axis of the cleaning roller 34, and as illustrated in FIGS. 2 and 3, a pair of splash preventing members may be formed in both sides of an upper portion of the cleaning roller 34.

A cover 38 is installed on an upper surface of the housing 32. The cover 38 is a constituent element for preventing the fluid from being splashed in an upward direction of the housing 32 according to a rotation of the cleaning roller 34.

One side 38a of the cover 38 is fixed to a lateral surface of the housing 32, and the other side 38b thereof extends toward the rotational center of the cleaning roller 34 when viewed in FIG. 2.

The cover 38 is formed as a pair in both sides of the housing 32 in a forward/backward direction when viewed in the transfer direction of the substrate. An opening is formed between the covers 38 to allow an upper end portion of the cleaning roller 34 to be protruded therethrough. The opening formed between the covers 38 may have an appropriate size to prevent the fluid from being splashed in the upward direction of the housing 32 when the cleaning roller 34 is rotated in the transfer direction of the substrate 2.

The operation of the cleaning unit 30 configured as described above will be described with reference to FIG. 3. While the substrate 2 is passing an upper portion of the cleaning unit 30, the cleaning roller 34 is rotated to allow the fluid to be applied to the lower surface of the substrate 2.

According to an embodiment of the present invention, the cleaning roller 34 is configured to include a cylindrical body 33 and a plurality of brushes 35 made of a flexible PVA material positioned to the outer circumference surface of the cylindrical body. Thus, in a state that the interior of the housing 32 is filled with the fluid by a predetermined depth (or to a degree), the plurality of brushes 35 at the lower portion of the cleaning roller 34 are impregnated with the fluid W.

A size and a length of each of the brushes 35 of the cleaning roller 34 may be experimentally selected such that the brushesbrushes 35 can be sufficiently impregnated with the fluid.

With the bushes 35 of the cleaning roller 34 impregnated with the fluid, when the cleaning roller 34 is rotated at a high speed, the cleaning roller 34 is rotated in a counterclockwise direction when viewed in FIG. 3, carrying the fluid W to an upper portion of the housing 32. Thus, when the substrate 2 moves toward the forward direction, the fluid W carried by the cleaning roller 34 is applied on the lower surface of the substrate 2 from the forward direction to the backward direction.

When the cleaning roller 34 transfers the fluid W to the upper portion of the housing 32, since the side walls of the housing 32 are spaced apart from the cleaning roller 34, a sufficiently large amount of fluid can be transferred to the upper portion of the housing 32.

If an excessive amount of fluid is transferred to the upper portion of the housing 32 according to a rotation, the fluid W may be splashed in the upward direction due to rotary power of the cleaning roller 34. Thus, in order to prevent an excessive amount of the fluid W from being transferred to the upper portion of the housing 32 by the rotary power of the cleaning roller 34, the splash preventing member 36 is installed.

In the embodiment of FIG. 3, it is illustrated that the splash preventing member 36 is configured as a pipe, but the size, shape, and position of the splash preventing member 36 for preventing an excessive amount of the fluid W from being transferred in the upward direction may be variously modified.

When the brushes 35 of the cleaning roller 34, in a state of being appropriately impregnated with the fluid, passes the position of the splash preventing member 36, the brushes 35 of the cleaning roller 34 may be brought into contact with a lower surface of the substrate 2. In this manner, as the brushes 35 is brought into contact with the lower surface of the substrate 2, the fluid W is applied to the substrate 2 and the substrate 2 is cleaned according to a type of the fluid applied thereto.

In spite of the presence of the splash preventing member 36, the covers 38 are formed in both sides of the upper surface of the housing 32, and thus, the fluid is prevented from being applied to the substrate 2 in other position than the opening between the covers 38.

As the fluid of the brushes 35 is applied to the lower surface of the substrate 2, the brushes 35 including small amount of the fluid is rotatably moved to a lower portion of the housing 32 and immersed in the fluid W positioned on the bottom portion of the housing 32, allowing the fluid W to be positioned in the roller brush 35.

In the substrate cleaning apparatus 1 according to an embodiment of the present invention, the cleaning roller 34 in the form of a brushes 35 is used to apply a liquid chemical or pure water to the lower surface of the substrate 2, the fluid is prevented from being splashed to the upper portion of the substrate 2, in comparison to the case in which the substrate is cleaned by a fluid injector in the form of a nozzle e.g. shower nozzle.

Referring to FIG. 2, when viewed in the transfer direction of the substrate 2, a substrate transfer sensor 60 is installed in front of the housing 32 and spaced apart from the housing 32 by a predetermined interval.

Referring to FIG. 2, the transfer sensor 60 is formed to be spaced apart from the housing 32 by a predetermined interval L2.

The transfer sensor 60 determines a position of the substrate 2 when the substrate 2 is moved toward the cleaning unit 30 or moved in a direction in which it becomes distant from the cleaning unit 30.

A controller (not shown) of the substrate cleaning apparatus 1 detects a position of an end portion of the substrate 2 using the transfer sensor 60, and calculates a transfer speed of the substrate 2, thereby determining an accurate position of the substrate 2 passing the cleaning unit 30.

According to an embodiment of the present invention, by variably controlling a rotational speed of the cleaning roller 34 according to a position of the substrate 2 detected by the transfer sensor 60, the fluid is prevented from being splashed to an upper surface of the substrate 2.

Hereinafter, an operation of the cleaning unit and the air supply unit according to the transfer of the substrate will be described in detail with reference to the accompanying drawings.

Figure 4:
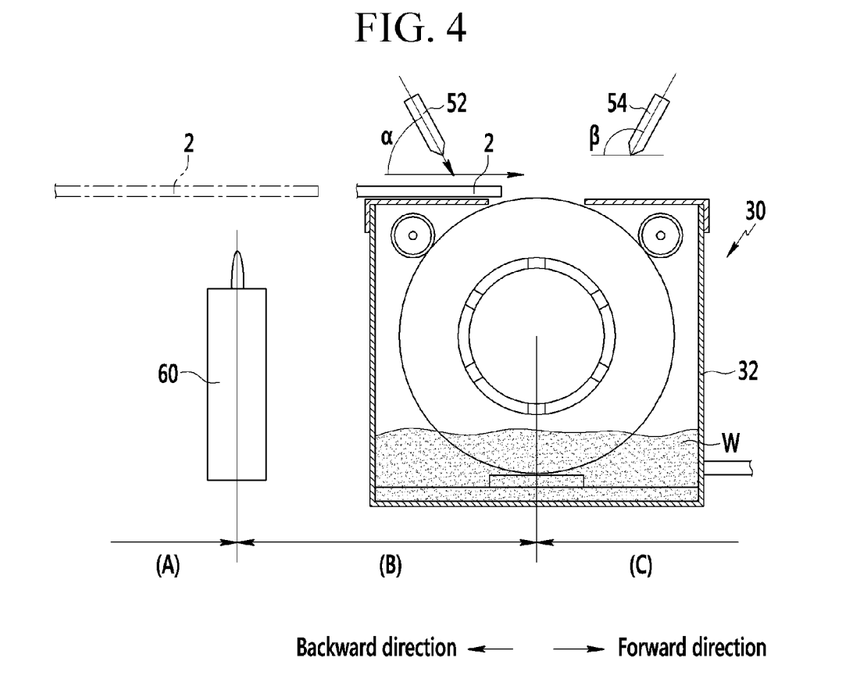
FIG. 4 is a view illustrating an operational state in which a substrate enters the cleaning unit of the substrate cleaning apparatus according to an embodiment of the present invention.
Figure 5:
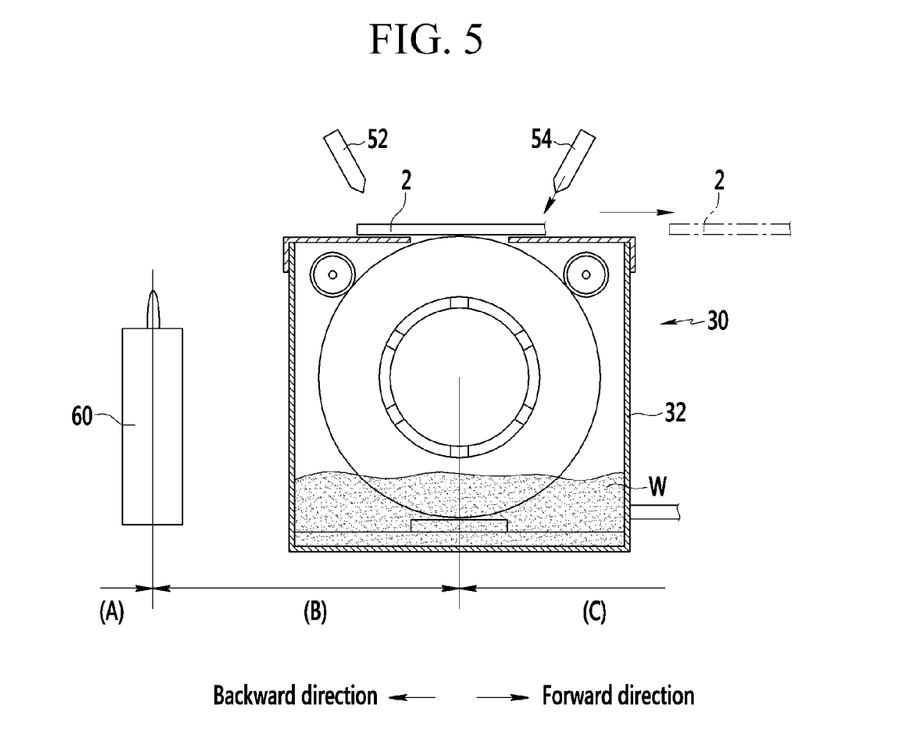
FIG. 5 is a view illustrating an operational state in which the substrate is released from the cleaning unit of the substrate cleaning apparatus according to an embodiment of the present invention.

FIG. 4 is a view illustrating an operational state in which a substrate enters the cleaning unit of the substrate cleaning apparatus according to an embodiment of the present invention. FIG. 5 is a view illustrating an operational state in which the substrate is released from the cleaning unit of the substrate cleaning apparatus according to an embodiment of the present invention.

Referring to FIG. 4, when the substrate 2 approaches the cleaning unit 30 in a section A and passes the transfer sensor 60 to enter a section B, the transfer sensor 60 senses a position of the substrate 2.

The transfer sensor 60 may determine whether the substrate 2 is present in an upper side of the transfer sensor 60. For example, when the substrate 2 is not present in the upper side of the transfer sensor 60, the transfer sensor 60 is maintained in an OFF state, and when the substrate 2 is present in the upper side of the transfer sensor 60, namely, when the substrate 2 passes the upper side of transfer sensor 60, the transfer sensor 60 may operate to be maintained in an ON state after the section B when viewed in FIG. 4.

In this manner, immediately when the transfer sensor 60 enters the ON state, the controller (not shown) of the substrate cleaning apparatus 1 checks a transfer speed of the substrate 2 moved by the transfer roller 40, thus determining a position of the substrate 2.

According to an embodiment of the present invention, when the transfer sensor 60 is turned on, a rotation speed of the cleaning roller 34 is maintained at a low speed, such as, for example, about 50 rpm, in the section B.

If the cleaning roller 34 rapidly rotates when the substrate 2 enters the cleaning unit 30, the fluid is highly likely to be splashed to an upper surface of the substrate 2 by rotary power of the cleaning roller 34. Thus, the rotation speed of the cleaning roller 34 is maintained at a low speed in the section B in which the substrate 2 approaches the cleaning unit 30, whereby the fluid is prevented from being splashed to the upper surface of the substrate 2.

Referring to FIG. 5, when the substrate 2 enters the upper portion of the cleaning roller 34 in the direction of the forward direction, reaching a section C, the cleaning roller 34 is rotated at a high speed, such as, for example, about 200 rpm, to clean the lower surface of the central portion of the substrate 2.

In this manner, when the cleaning roller 34 is rotated at a high speed so as to be brought into contact with the lower surface of the substrate 2 to allow the fluid from being applied to the lower surface of the substrate 2, the lower surface of the substrate 2 is cleaned by the fluid applied thereto.

While the cleaning roller 34 is being rotated at a high speed, air is discharged to the upper surface of the substrate 2 through the first air knife 52 to thrust the fluid, i.e., a fluid chemical or pure water, present on a front end portion of the substrate 2 from the upper surface of the substrate 2, thus preventing the fluid from being splashed to the upper surface of the substrate 2.

When the substrate 2 is moved to pass the transfer sensor 60 and a rear end portion of the substrate 2 is moved to the section B, the transfer sensor 60 is turned off and the movement of the rear end portion of the substrate 2 toward the cleaning unit 30 is sensed.

In this manner, when the rear end portion of the substrate 2 is moved toward the cleaning unit 30, the rotation speed of the cleaning roller 34 of the cleaning unit 30 is reduced to a low speed, such as, for example, about 50 rpm.

In this manner, since the rotation speed of the cleaning roller 34 is reduced in a state that the rear end portion of the substrate 2 is close to the cleaning roller 34, the fluid is prevented from being splashed to the upper surface of the rear end portion of the substrate 2.

While the rotation speed of the cleaning roller 34 is reduced, air is discharged to the upper surface of the substrate 2 through the second air knife 54 to thrust the fluid splashed to be present on the upper surface of the substrate, thus preventing the fluid from being present on the upper surface of the substrate 2.

A rotation speed of the cleaning roller 34, an operation time of the air knife, an operation pressure of the air knife, and a transfer speed of the substrate while the substrate 2 is being transferred may be experimentally selected such that the lower surface of the substrate is cleaned while the fluid is prevented from being splashed to the upper surface of the substrate.

In the case of the substrate cleaning apparatus according to an embodiment of the present invention, since the cleaning roller such as a brushes is used in supplying a liquid chemical and pure water to the substrate, the liquid chemical and pure water can be prevented from being splashed to the upper surface of the substrate.

Also, in the case of the substrate cleaning apparatus according to an embodiment of the present invention, when a liquid chemical and pure water is supplied to the substrate, the speed of the brushes is variably controlled to prevent the fluid chemical and pure water from being splashed to the upper surface of the substrate.

Also, in the case of the substrate cleaning apparatus according to an embodiment of the present invention, since the air knife is present for discharging air to the upper surface of the substrate, the fluid chemical and pure water can be prevented from being splashed to the upper surface of the substrate.

While this invention has been described in connection with certain embodiments, it is to be understood that the invention is not limited to the disclosed embodiments, but, on the contrary, is intended to cover various modifications and equivalent arrangements included within the spirit and scope of the appended claims.

What is claimed is:

1. A substrate cleaning apparatus comprising:
    a plurality of transfer rollers for transferring a substrate in a transfer direction;
    a liquid chemical feeder supplying a liquid chemical to a first surface of the substrate, wherein the liquid chemical feeder comprises:
        a first housing, and
        a first cleaning roller rotatably installed within the first housing and having an upper portion configured to contact with the substrate;
    an air supply unit comprising a pair of air knives, wherein the pair of air knives is positioned above and facing the first cleaning roller, wherein the pair of air knives is positioned in front and rear sides, respectively, of the first cleaning roller when viewed in the transfer direction of the substrate and wherein among the pair of air knives, the air knife positioned in the front side is sloped to the rear side, and the air knife positioned in the rear side is sloped to the front side, wherein a line of infinite length oriented parallel to the air knife positioned in the front side would have a negative slope and a line of infinite length oriented parallel to the air knife positioned in the rear side would have a positive slope; and
    a splash preventing member disposed adjacent to the cleaning roller at a position higher than a rotational central axis of the cleaning roller in order to prevent the cleaning roller from being moved when impregnated with a large amount of fluid when rotated,
    wherein the splash preventing member further comprises a cover positioned on an upper surface of the housing and as a pair in both sides of the cleaning roller, the cover configured to prevent the fluid from being splashed according to a rotation of the cleaning roller and an upper end portion of the cleaning roller is protruded to an opening between the pair of splash preventing covers, wherein the plurality of transfer rollers transfer the substrate from the front side to the rear side of the first cleaning roller.

2. A substrate cleaning apparatus according to claim 1 further comprising:
    a pure water feeder supplying pure water to the first surface of the substrate configured to remove at least part of the fluid chemical supplied to the first surface, wherein the pure water feeder comprises:
        a second housing and
        a second cleaning roller rotatably installed within the second housing and having an upper portion configured to contact with the substrate.

3. The substrate cleaning apparatus of claim 2, wherein each of the liquid chemical feeder and the pure water feeder comprises:
    a pump supplying a fluid to the interior of the respective housing; and
    a fluid storage tank storing the fluid supplied to the interior of the respective housing,
    wherein a portion of the cleaning roller is immersed in the fluid supplied to the interior of the respective housing.

4. The substrate cleaning apparatus of claim 3, wherein each cleaning roller comprises a cylindrical body and a plurality of brushes positioned to an outer circumference surface of the cylindrical body.

5. The substrate cleaning apparatus of claim 2, wherein each housing comprises a length direction in which an axis of the respective cleaning roller extends, and
    when the direction in which the axis of each respective cleaning roller extends is perpendicular to the transfer direction of the substrate, a width of each housing parallel to the transfer direction of the substrate is longer than a diameter of each respective cleaning roller.

6. The substrate cleaning apparatus of claim 2, wherein the pair of air knives is positioned above the liquid chemical feeder and the pure water feeder.

7. The substrate cleaning apparatus of claim 2, wherein when viewed in the transfer direction of the substrate, the pure water feeder is positioned in a rear side of the liquid chemical feeder.

8. The substrate cleaning apparatus of claim 2, wherein a plurality of pure water feeders is formed.

9. The substrate cleaning apparatus of claim 2, wherein the apparatus further comprises a substrate movement sensor spaced apart from the first and/or the second housing in front of the first and/or the second housing when viewed in the transfer direction of the substrate.

10. The substrate cleaning apparatus of claim 9, wherein when the substrate movement sensor senses that the substrate enters an upper side of the first and/or the second housing and is discharged from the upper side of the first and/or the second housing, a speed of brushes of the first and/or the second cleaning roller is variably controlled.

11. The substrate cleaning apparatus of claim 10, wherein when viewed in the transfer direction of the substrate, a speed at which a front end portion of the substrate moves to pass the movement sensor to reach an upper portion of the first and/or the second cleaning roller and a speed at which a rear end portion of the substrate moves to pass the movement sensor to reach the upper portion of the first and/or the second cleaning roller is slower than a speed at which a central portion of the substrate moves to pass an upper portion of the first and/or the second cleaning roller.

12. The substrate cleaning apparatus of claim 1, wherein the air supply unit is installed on an upper portion of a second surface of the substrate in order to prevent the liquid chemical from being splashed to the second surface of the substrate.

13. The substrate cleaning apparatus of claim 1, wherein the splash preventing member is positioned to be lower than the substrate and higher than the rotational central axis of the cleaning roller.

14. The substrate cleaning apparatus of claim 1, wherein the splash preventing member is a pipe disposed to be parallel to the rotational central axis.

15. The substrate cleaning apparatus of claim 1, wherein the splash preventing member is formed as a pair at both sides of the upper portion of the cleaning roller.

* * * * *